(12) United States Patent
Uchiyama et al.

(10) Patent No.: US 7,024,122 B2
(45) Date of Patent: Apr. 4, 2006

(54) ULTRAHIGH-SPEED CLOCK EXTRACTION CIRCUIT

(75) Inventors: Kentaro Uchiyama, Shinagawa-ku (JP); Hidehiko Takara, Yokosuka (JP); Eiichi Yamada, Sagamihara (JP); Etsu Hashimoto, Fujisawa (JP); Toshio Morioka, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 691 days.

(21) Appl. No.: 10/285,525

(22) Filed: Nov. 1, 2002

(65) Prior Publication Data

US 2003/0117196 A1 Jun. 26, 2003

(30) Foreign Application Priority Data

Nov. 2, 2001 (JP) ............................. 2001-337636

(51) Int. Cl.
*H04B 10/00* (2006.01)

(52) U.S. Cl. ...................................... 398/155; 398/163

(58) Field of Classification Search ................ 398/154, 398/155, 163, 175, 176
See application file for complete search history.

(56) References Cited

U.S. PATENT DOCUMENTS

| 5,706,113 A | 1/1998 | Kawanishi et al. ......... 398/212 |
| 5,999,287 A | 12/1999 | Davies et al. .................. 398/98 |
| 6,560,007 B1 * | 5/2003 | Uchiyama et al. .......... 359/328 |

FOREIGN PATENT DOCUMENTS

| EP | 0 595 206 | 5/1994 |
| EP | 1 119 119 A1 | 7/2001 |

OTHER PUBLICATIONS

Patent Abstracts of Japan, JP 10-209962, Aug. 7, 1998.
I. D. Phillips, et al., Electronics Letters, vol. 36, No. 7, XP-006015059, pp. 650-651, "100 Gbit/s Optical Clock Recovery Using Electrical Phaselocked Loop Consisting of Commercially Available Components", Mar. 30, 2000.
K. Uchiyama, et al., "All-Optical Time-Division Demultiplexing Experiment With Simultaneous Output of All Constituent Channels From 100Gbit/s OTDM Signal", Electronics Letters, vol. 37, No. 10, May 10, 2001, pp. 1-2.
Kentaro Uchiyama, et al., "160-Gbit/s All-Optical Time-Division Demultiplexing Utilizing Modified Multiple-Output OTDM Demultiplexer (MOXIC)", Electronics Letters, vol. 38, No. 20, 10 pages.

* cited by examiner

*Primary Examiner*—Christina Y Leung
(74) *Attorney, Agent, or Firm*—Oblon, Spivak, McClelland, Maier & Neustadt, P.C.

(57) ABSTRACT

In an ultrahigh-speed clock extraction circuit wherein a local pulse generating light source 22 for generating a local optical pulse stream synchronized in bit phase with an input optical signal pulse stream is placed in a phase-locked loop, when repetition frequencies of the input optical signal pulse stream and the local optical pulse stream bear a particular relationship, a frequency demultiplier 32 and multipliers 43 and 52 are set so that the frequency of a modulation signal for an optical modulator 41 and a frequency which is a natural-number multiple of the modulation signal frequency, and the frequency of a down-converted version of an optical pulse stream output from a photodetector 42 differ from each other.

13 Claims, 9 Drawing Sheets

ULTRAHIGH-SPEED CLOCK EXTRACTION CIRCUIT

BACKGROUND OF THE INVENTION

The present invention relates to an ultrahigh-speed clock extraction circuit that generates a local optical pulse stream or local electrical clock synchronized in bit phase with an ultrahigh-speed optical signal pulse stream of a repetition frequency over 100 Gbit/s which is input from the transmission line.

An increase in data traffic with the recent rapid widespread proliferation of the Internet is accelerating the implementation of larger-capacity optical communication networks. Along with wavelength multiplexing, time-division multiplexing is an effective technique for increasing the channel capacity or rate of each optical fiber, but the channel rate now achieved by speedups of electronic circuits is as high as 40 Gbit/s and further speedups are not easy. Optical signal processing, which utilizes the nonlinear optical effect that provides a response on the order of subpico second, is expected to overcome the band limitations on electronic circuits and is now under study and development with a view towards active application to optical communications.

The optical signal processing based on the nonlinear optical effect is to cause timed interaction between the received optical signal and a locally generated optical signal (locally generated optical control signal) to perform various signal processing operations, such as switching, wavelength conversion and so forth, in the domain of light. The required accuracy of timing for the interaction increases with faster optical signal processing, for example, 1 ps or below for 100 Gbit/s signal processing. In optical communications, the optical signal usually propagates through optical fibers over a long distance, and consequently, the timing of arrival of the optical signal at the receiving side varies due to expansion and contraction of the optical fibers. Accordingly, identification of each bit of the received optical signal usually calls for extraction of a clock corresponding to the varying timing of arrival at the receiving side. To perform the optical signal processing, it is necessary that the receiving side generate, as the local clock, a local optical control pulse stream of the varying timing of the received optical signal. The optical control pulse stream is generated, in general, by a mode-locked laser or similar short-pulse laser and subjected to amplification and other processing by an optical fiber amplifier and is then coupled or combined with the received optical signal; in this instance, a propagation delay in the processing circuit itself, which is caused by temperature-dependent expansion or contraction of the optical fiber forming it, readily varies with ambient temperature at a rate of approximately 50 ps/km/° C., constituting a critical factor that prevents appropriate optical signal processing.

Figure 1:
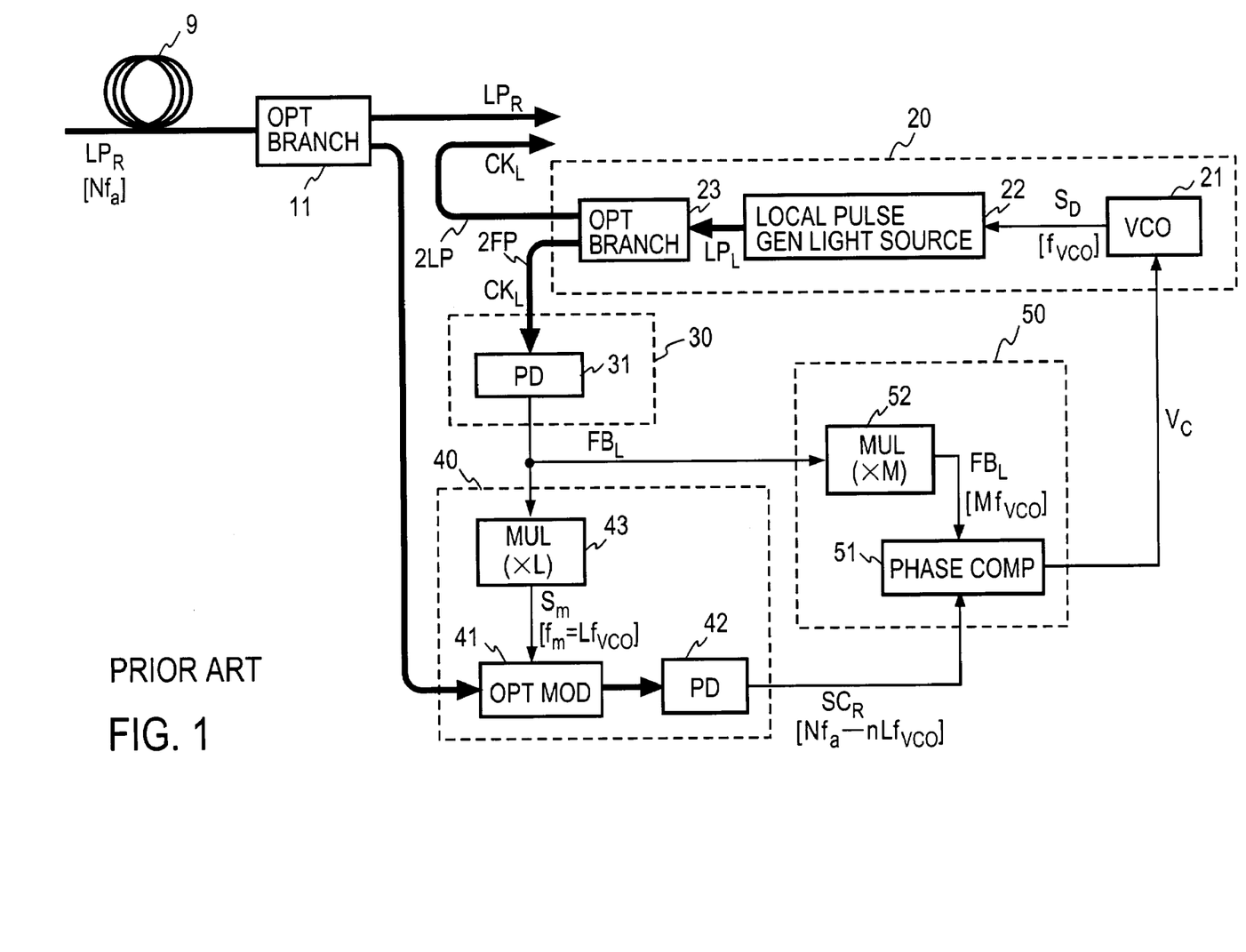
FIG. 1 is a block diagram showing an example of a conventional ultrahigh-speed clock extraction circuit.

FIG. 1 is a block diagram depicting an example of a conventional ultrahigh-speed clock extraction circuit described in European Patent Application Publication EP 1119119A 1 (corresponding US Patent Application Publication Gazette US2002/0027692A1).

The illustrated ultrahigh-speed clock extraction circuit comprises: a local clock generating part 20 for generating a local clock $CK_L$; a local feedback signal generating 30 for generating a local feedback signal $FB_L$; an input signal component generating part 40 for extracting an input signal component $SC_R$ from an input optical signal pulse stream $LP_R$; and a phase comparison part 50 which compares the phases of the local feedback signal $FB_L$ and the input signal component $SC_R$ and provides the comparison result, as a voltage control signal $V_C$, to the local clock generating part 20. The local clock generating part 20, the local feedback signal generating part 30 and the phase comparison part 50 constitute a phase-locked loop.

The local clock generating part 20 is made up of a voltage-controlled oscillator 21, a local pulse generating light source 22, and an optical branching device 23. The input signal component generating part 40 is made up of an optical modulator 41, a photodetector 42 and a multiplexer 43. In the accompanying drawings, symbols in each pair of brackets [**] are intended to represent a frequency, and thick solid lines indicate optical signal paths and thin solid lines electrical signal paths.

The input optical signal pulse stream $LP_R$ of a repetition frequency $Nf_a$ (where N is the number of multiplex channels), sent over an optical fiber transmission line 9, is branched by an optical branching device 11 into two, one of which is output as an original input optical signal pulse stream $LP_R$ and the other of which is fed to the optical modulator 41 of the input signal component generating part 40. On the other hand, the local pulse generating light source 22 is driven by a drive signal $S_D$ of a frequency $f_{VCO}$ from the voltage-controlled oscillator 21 to generate a local optical pulse stream $LP_L$. The local optical pulse stream $LP_L$ is branched by the optical branching device 23 into two, one of which is output as the local clock $CK_L$ via a local output path 2LP and the other of which is fed via a feedback path 2FP to the photodetector 31 for conversion into the local feedback electrical signal $FB_L$.

The local feedback signal $FB_L$ of the frequency $f_{VCO}$ from the photodetector 31 is branched into two, one of which is L-multiplied by the multiplier 43 to a modulation signal $S_m$ of a frequency $f_m = Lf_{VCO}$, which is applied to the optical modulator 41. The optical modulator 41 is one that has a property of linearly responding to the electrical drive signal, for example, an electroabsorption optical modulator.

The input signal component $SC_R$ of a frequency $Nf_a - n(Lf_{VCO})$ (where n is a natural number) is extracted by the photodetector 42 from the optical signal output from the optical modulator 41, and the extracted signal is provided to a phase comparator 51. The electrical feedback signal $FB_L$ branched from the photodetector 31 is M-multiplied by a multiplexer 52 into a signal $FB_L$ of a frequency $Mf_{VCO}$, which is applied to the phase comparator 51 for comparison with the input signal component $SC_R$ of the frequency $Nf_a - n(Lf_{VCO})$. An error signal resulting from the comparison is fed back as the voltage control signal $V_C$ to the voltage-controlled oscillator 21 to control its oscillation frequency $f_{VCO}$. As a result, the local optical pulse stream LPL from the local pulse generating light source 22, which is output from the optical branching device 23, is provided from the local output path 2LP as the local clock $CK_L$ synchronized in bit phase with the input optical signal pulse stream $LP_R$.

Figure 2A:
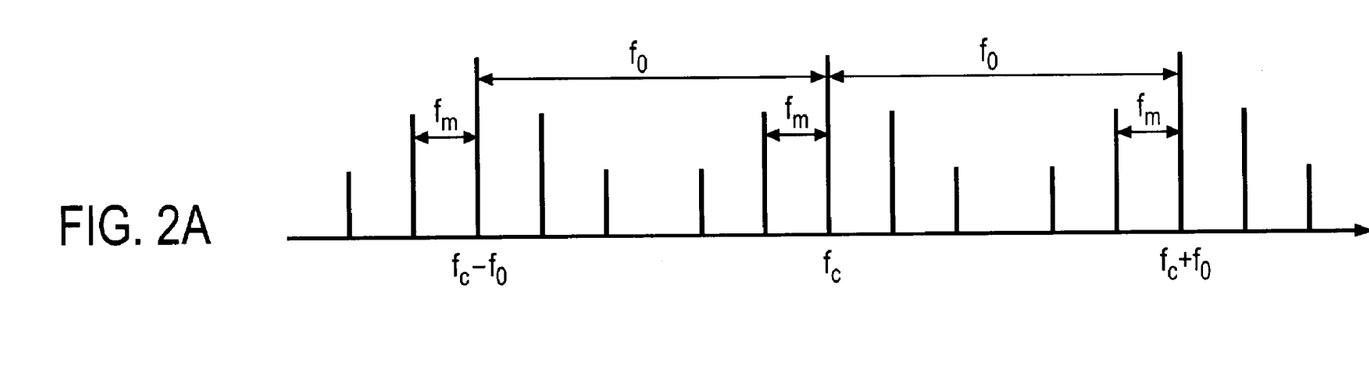
FIG. 2A is a diagram for explaining the optical frequency spectrum of the output from an optical modulator 43 in FIG. 1.
Figure 2B:
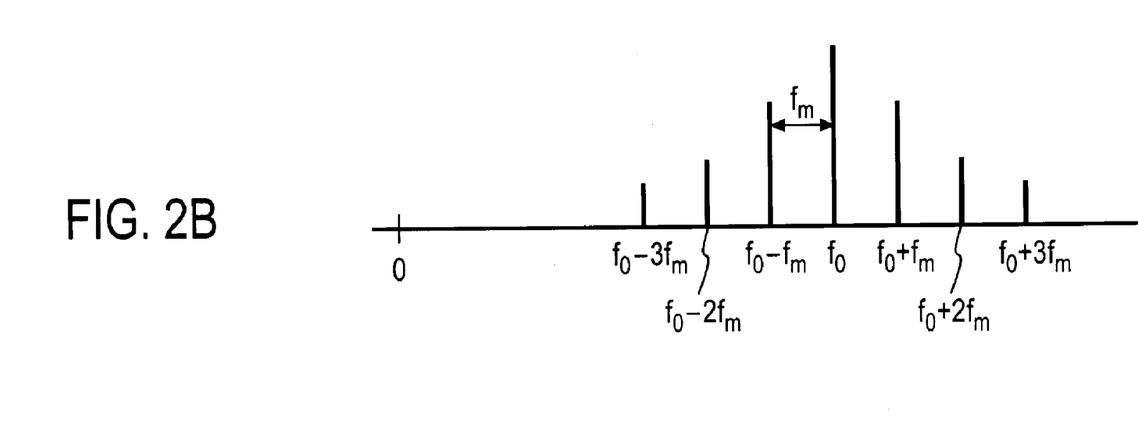
FIG. 2B is a diagram for explaining the electrical spectrum of the output from a photodetector 42 in FIG. 1.

Referring next to FIGS. 2A and 2B, the function of the optical modulator 41 will be described.

FIG. 2A depicts the frequency spectrum of the output light from the optical modulator 41 when an optical pulse stream of a repetition frequency $f_0$ is modulated therein by the modulation signal $S_m$ of the frequency $f_m$. The optical pulse stream of the repetition frequency $f_0$ has modulated components $f_c + f_0$ and $f_c - f_0$ on both sides of an optical carrier frequency $f_c$. Modulating the optical pulse stream by the electrical signal $S_m$ of the frequency $f_m$ in the optical modulator 41, many modulated sidebands are newly generated by the frequency $f_m$ around the carrier component $f_c$ and the modulated components $f_c \pm f_o$, respectively, as shown in FIG.

2A. By converting such a modulated signal in the photodetector 42 into an electrical signal, beat signals ($f_c \pm nf_m$, where n is a natural number) appear in its power spectrum at intervals $f_m$ about the repetition frequency $f_0$ as depicted in FIG. 2B. Even with the actual photodiode of limited frequency band, it is possible to detect beat signals in the low-frequency region.

The modulated sidebands hold phase information of the original signal, and the phase information is also reflected in the beat between the modulated sidebands. Accordingly, by forming a phase-locked loop through use of the beat signal that is produced by applying the modulation signal $S_m$ of the frequency $f_m = Lf_{VCO}$ from the multiplexer 43 to the optical modulator 41, it is possible to generate an electrical signal synchronized with an optical pulse stream of a repetition frequency over 100 GHz.

Consider, for example, the case where $Nf_a = 160$ GHz, $f_{VCO} = 20$ GHz and $L=M=2$ in the conventional ultrahigh-speed clock extraction circuit depicted in FIG. 1. This case corresponds to the generation of an optical control pulse stream (i.e., local optical pulse stream $LP_L$) synchronized in bit phase with a time-division-multiplexed optical signal (i.e., input optical pulse stream $LP_R$) of a repetition frequency 160 GHz and having a repetition frequency 20 GHz. The modulation frequency of the optical modulator 41 is $f_m = Lf_{VCO} = 40$ GHz, and the beat signal frequencies that are observed at the output of the photodetector 42 are $160-n \times 40 = 120$, 80 and 40 (GHz) for $n=1$, 2 and 3, respectively. From the viewpoint of frequency bands possible with electric circuits, 40 GHz is appropriate for phase comparison use. The setting $M=2$ for the multiplier 52 in the phase comparison part 50 corresponds to the phase comparison frequency 40 GHz.

The above condition for operation raises such a problem as described below. That is, the beat signal at the output of the photodetector 42 contains not only the beat (first beat components $160-n \times 40$, where $n=0, 1, 2, 3, \ldots$) between the 160 GHz component of the input optical signal and the modulation frequency ($f_m = Lf_{VCO} = 40$ GHz) component of the optical modulator 41 but also a beat between the DC (0 Hz) component of the input optical signal and the modulation frequency $f_m$ (40 GHz) component of the optical modulator 41; namely, the output signal from the photodetector 42 contains, as a second beat component, components of the frequency $f_m$ of the modulation signal $S_m$ and a frequency $kf_m$ (where $k=1, 2, \ldots$) that is a natural-number k multiple of the frequency $f_m$. Thus, the first and second beat components both contain exactly the same frequency 40 GHz. As referred to previously, the first beat component of the frequency $160-nf_m$ has the phase information of the input optical signal and is utilized in the phase-locked loop, but the second beat components $kf_m$ (frequencies 40, 80, . . . GHz) do not contain the phase information of the input optical signal. Hence, the presence of the second beat components interferes with the phase comparison by the phase comparator 51 between the first beat component and the output component $Mf_{VCO}$ from the multiplexer 52, making the entire operation of the phase-locked loop unstable.

Further, for example, when $L=3$, $M=2$ and $n=2$, then $f_m = 60$ GHz; if the 40 GHz component is used as the first beat component (100, 40, . . . (GHz)), it is possible to avoid the interference by the second beat component (60, 120, . . . (GHz)) at the phase comparison frequency 40 GHz. In other words, it is possible to avoid that the first and second beat components contain the same frequency. This requires, however, the use of $f_m = 60$ GHz (and 40 GHz as the phase comparison frequency) as the modulation frequency; in the present microwave technology, this scheme is appreciably disadvantageous in terms of cost and performance as compared with the case of using frequencies down to the K band lower than 26.5 GHz.

In short, any combinations of the parameters L, M and n neither permit cost reduction nor provide stability in the generation of the local clock $CK_L$ synchronized in bit phase with the 160 Gbit/s optical time-division-multiplexed signal and having the 20 GHz repetition frequency.

SUMMARY OF THE INVENTION

It is therefore an object of the present invention to provide an ultrahigh-speed clock extraction circuit which prevents the frequency of a down-converted electrical signal having phase information of the input optical signal from becoming the same as the frequency resulting from the modulation of the DC component contained in the input optical signal by the optical modulator and a frequency of a natural-number multiple of that frequency and, at the same time, suppresses an increase in the signal frequency in the phase-locked loop, ensuring low-cost and stable generation of a local optical pulse stream synchronized in bit phase with the input optical signal.

The present invention offers a basic technique indispensable to stabilization of all-optical signal processing by compensating for delay fluctuations in the optical control signal generating system as well to thereby enable the received optical signal pulse stream and the optical control pulse stream to maintain their mutual positional relationship with errors between their bits held below subpicosecond.

To solve the afore-mentioned problems of the prior art, the ultrahigh-speed clock extraction circuit according to the present invention comprises:

a local clock generating part which generates a local clock of a frequency controlled by a voltage control signal and branches the local clock into a local output clock and a local feedback clock;

a local feedback signal generating part which generates a local feedback signal from said local feedback clock;

an input signal component generating part made up of a modulation signal generating part for generating a modulation signal containing phase information of said local feedback signal, an optical modulator for modulating an input optical signal pulse stream by said modulation signal to generate a modulated input optical signal stream, and a photodetector supplied with said modulated input optical signal pulse stream, for outputting an input signal component electrical signal having a down-converted frequency of said modulated input optical signal pulse stream and having bit-phase information thereof;

a phase comparison part which compares the phases of said local feedback signal and said input signal component electrical signal and outputs, as said voltage control signal, the voltage corresponding to their phase difference; and ratio setting means which sets the frequency of said local feedback signal to an integral fraction of the frequency of said output local clock so that said down-converted frequency of said input signal component electrical signal differs from a natural-number multiple of the frequency of said modulation signal;

wherein a path containing said phase comparison part, said local clock generating part and said local feedback signal generating part constitutes a phase-locked loop for said input signal component electrical signal.

With the ratio setting means, it is possible to prevent that the frequency of the modulation signal for application to the optical modulator becomes a natural-number fraction of the repetition frequency $Nf_a$ of the input optical signal pulse stream. Accordingly, it is possible to avoid that the frequency of the down-converted electric signal having the phase information of the input optical signal becomes identical with the frequency that results from the modulation of he DC component of the input optical signal by the optical modulator.

In the ultrahigh-speed clock extraction circuit, the local clock generating part may be formed by a voltage-controlled oscillator, a local pulse generating light source and an optical branching device, and the local feedback signal generating part may be formed by a photodetector and a frequency demultiplier.

The local clock generating part may also be formed by a voltage-controlled oscillator and a multiplexer so that a local electrical clock is output as the local clock from the multiplier and the output from the voltage-controlled oscillator is applied as an electrical signal to the local feedback signal generating part to generate the local feedback signal.

In the ultrahigh-speed clock extraction circuit the local optical pulse from the local clock generating part may be applied to the local feedback signal generating part after being frequency demultiplied by an optical frequency demultiplier.

In the ultrahigh-speed clock extraction circuit the local clock may be multiplied by an optical multiplier to yield the output local clock. This permits suppression of the repetition frequency of the local optical pulse from the local optical pulse generating light source, by which it is possible to obtain in the phase-locked loop the same signal frequency as that obtainable by frequency demultiplying the photodetector output in the local feedback signal generating part.

The ultrahigh-speed clock extraction circuit may also be adapted so that the local clock is multiplied by an optical multiplier to generate the output local clock while at the same time the feedback clock is frequency demultiplied in the local feedback signal generating part. Such individual generation of the two clocks increases flexibility in circuit design, providing increased operation stability and permitting cost reduction.

The present invention provides a circuit for generating a local optical pulse stream or local electrical clock synchronized in phase with the input optical signal pulse stream. The circuit uses a phase detecting technique utilizing modulated sidebands resulting from optical modulation and a phase-locked loop technique.

Conventionally, the phase comparison frequency in the phase-locked loop and the optical modulation frequency may sometimes become equal, making the operation of the phase-locked loop unstable. To avoid this, the present invention offers a construction having a frequency demultiplier in the phase-locked loop, a construction having an optical multiplier for K-multiplying the repetition frequency of the local optical pulse stream in the domain of light, and a construction provided with the frequency demultiplier and the optical multiplier in combination.

DETAILED DESCRIPTION OF THE PREFERRED EMBODIMENTS

Embodiment 1

Figure 3:
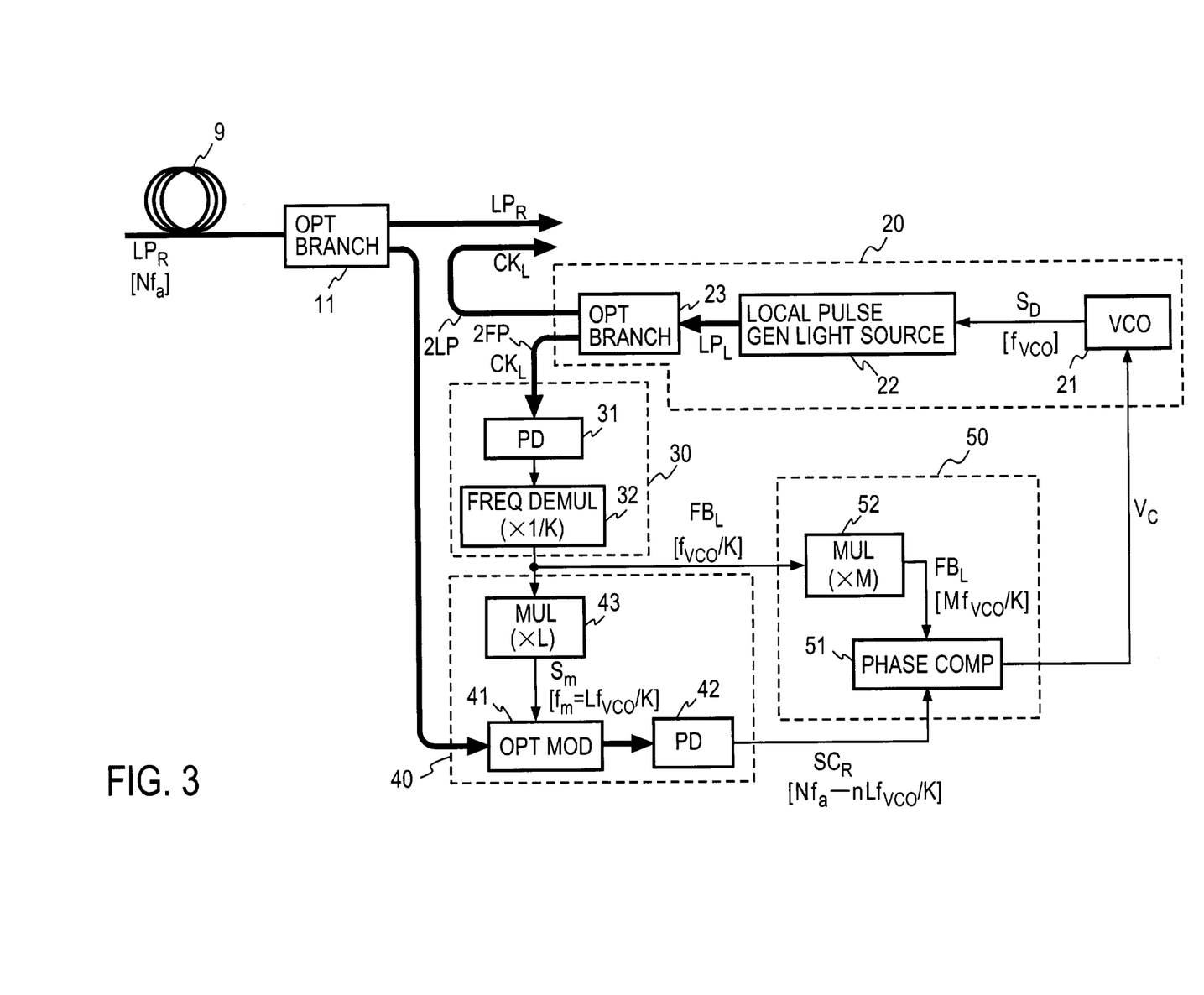
FIG. 3 is a block diagram illustrating a first embodiment of the ultrahigh-speed clock extraction circuit according to the present invention.

FIG. 3 illustrates in block form a first embodiment of the ultrahigh-speed clock extraction circuit according to the present invention. As is the case with the prior art example of FIG. 1, the ultrahigh-speed clock extraction circuit of this embodiment is made up of the local clock generating part 20, the local feedback signal generating part 30, the input signal component generating part 40 and the phase comparison part 50; furthermore, the local clock generating part 20, the input signal component generating part 40 and the phase comparison part 50 are also identical in construction with the corresponding parts in FIG. 1. This embodiment differs from the prior art example in that the local feedback signal generating part 30 includes a frequency demultiplier 32, which divides the frequency $f_{VCO}$ of the output signal from the photodetector 31 down to 1/K and outputs the local feedback signal $FB_L$ of the frequency $f_{VCO}/K$.

The input optical signal pulse stream $LP_R$ of the repetition frequency $Nf_a$ is branched by the optical branching device 11 into two, one of which is input to the optical modulator 41. On the other hand, the local pulse generating light source 22 is driven by the drive signal $S_D$ of the frequency $f_{VCO}$ from the voltage-controlled oscillator 21 to generate the local optical pulse stream $LP_L$ of the repetition frequency $f_{VCO}$. The local optical pulse stream $LP_L$ is branched by the optical branching device 23 into two, one of which is provided via the feedback path 2FP to the photodetector 31 for conversion to an electrical signal. In this embodiment, the output electrical signal of the frequency $f_{VCO}$ from the photodetector 31 is frequency demultiplied by the frequency demultiplier 32 down to 1/K to form the local feedback signal $FB_L$ of the $f_{VCO}/K$, which is branched into two, one of which is L-multiplied by the multiplier 43 into the modulation signal $S_m$ of the frequency $f_m = Lf_{VCO}/K$ for driving the optical modulator 41.

The optical modulator 41 used in this embodiment is a modulator which nonlinearly responds to the electrical drive signal (i.e. the modulation signal $S_m$), such as an intensity modulator, electroabsorption modulator, semiconductor optical modulator, optical comb generator, or optical phase modulator. Incidentally, the optical modulator 41 may also be formed by an optical modulator that has a linear response characteristic. The same is true of the embodiments described later on.

The frequency demultiplier 32 is formed by, for example, a flip-flop circuit, pulse accumulation circuit, or feedback frequency demultiplier using a monostable multivibrator. As a high-speed frequency demultiplier that operates at 20 GHz, there is available, for example, MOF08A(T-FF) by NTT Electronics, Ltd.

The output optical signal from the optical modulator 41 is converted by the photodetector 42 to the input signal component electrical signal $SC_R$ of a frequency $Nf_a-(nL/K)f_{VCO}$ (where n is a natural number), which is fed to the phase comparator 51. The other output signal from the frequency demultiplier 32, that is, the local feedback signal $FB_L$, is M-multiplied by the multiplier 52, and the M-multiplied signal $FB_L$ is provided to the phase comparator 51 for phase comparison with the input signal component electrical signal $SC_R$ of the frequency $Nf_a-(nL/K)f_{VCO}$. In this case, the values of the integers L, K and M are chosen such that $Nf_a-(nL/K)f_{VCO}=(M/K)f_{VCO}$. An error signal resulting from the phase comparison is fed back as the voltage control signal $V_C$ to the voltage-controlled oscillator 21 to control its oscillation frequency $f_{VCO}$.

As a result, the local pulse stream $LP_L$ from the local pulse generating light source 22 is provided from the local output path 2LP as the local clock $CK_L$ which is in bit-phase synchronization with the input optical signal pulse stream $LP_R$. The frequency demultiplier 32 in this embodiment constitutes ratio setting means for setting the frequency of the local feedback signal $FB_L$ to an integral (2 or larger) fraction of the frequency of the local output clock $CK_L$.

In Table 1 there are shown concrete examples of numerical values of parameters N, $f_a$, $f_{VCO}$, K, L, M, $f_m$, n, and $Nf_a-nf_m$ for some examples of the repetition frequency of the input optical signal pulse stream.

depending on the manner of selecting the frequency for phase comparison in the phase comparator 51. When the frequency multiplication number is 1, the multiplier does not ever affect the input electrical signal, and hence it can be omitted. This applies to the following embodiments; that is, multipliers whose multiplication numbers are 1 can be omitted.

Moreover, the voltage-controlled oscillator 21 may be combined with a multiplier. That is, a voltage-controlled oscillator of a frequency $(1/Q)f_{VCO}$ and a multiplier of a multiplication number Q can be combined. The same is true of the embodiments described below. The phase comparison frequency $(Nf_a-nf_m)$ may preferably be low so as to use commercially available digital PLL-IC (of a band <1 GHz) or the like. It must be noted here that the numerical values given in the rows Nos. 4 and 5 in Table 1 are examples intended to lower the phase comparison frequency $Nf_a-nf_m$. The configuration for decreasing the phase comparison frequency is already described as well in the afore-mentioned European Patent Application Publication EP1119119A1.

Embodiment 2

Figure 4:
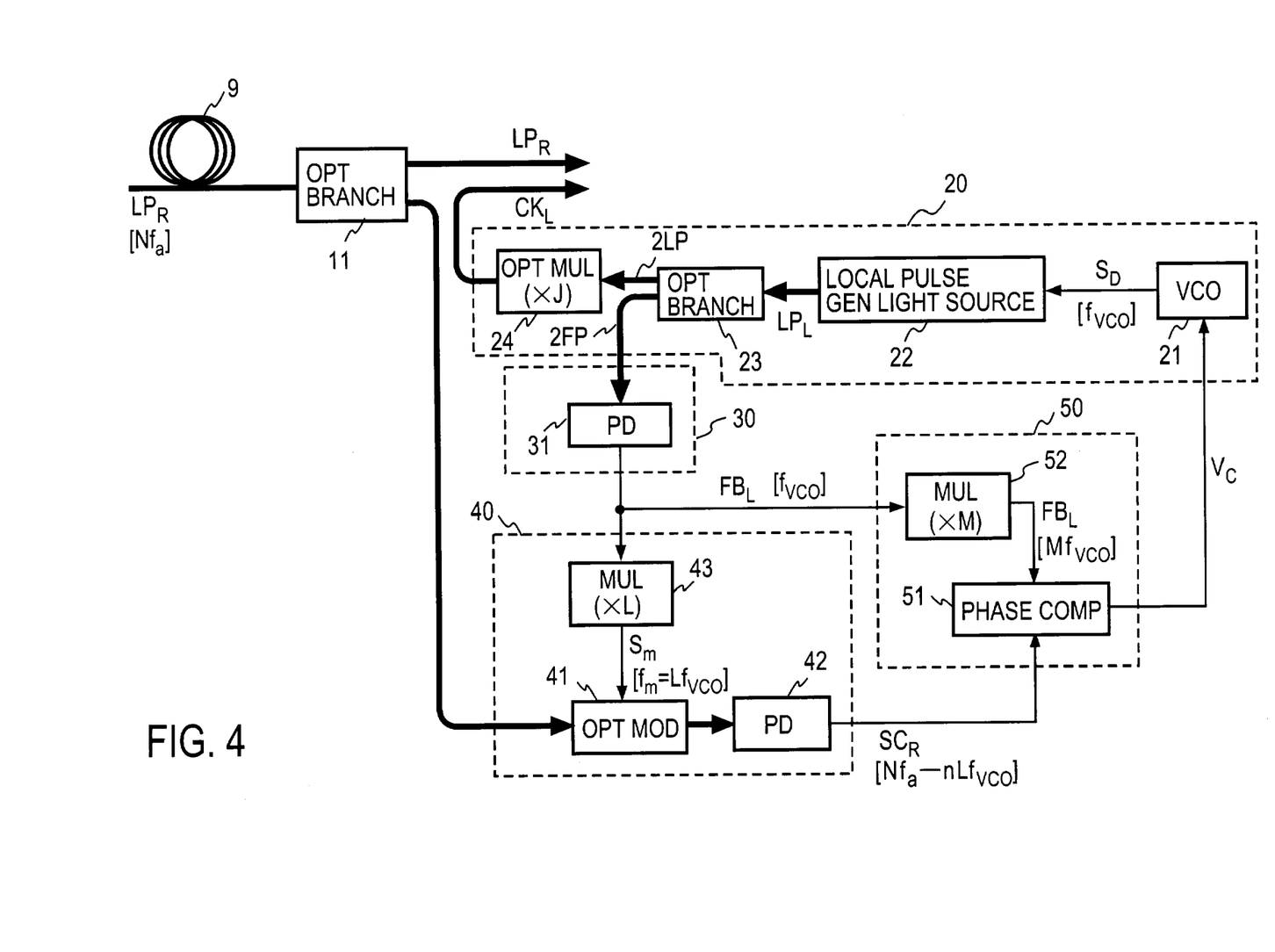
FIG. 4 is a block diagram illustrating a second embodiment of the ultrahigh-speed clock extraction circuit according to the present invention.

FIG. 4 illustrates in block form a second embodiment of the ultrahigh-speed clock extraction circuit according to the present invention, which is a modified form of the first embodiment. In this embodiment, the frequency demultiplier 32 is not provided in the local feedback signal generating part 30 as in the first embodiment, but instead an optical multiplier 24 is provided in the output path 2LP of the optical branching device 23 so that the output local clock is J-multiplied. Accordingly, the frequency of the local feedback signal $FB_L$, which is output from the feedback signal generating part 30 is $f_{VCO}$, and the frequency of the modulation signal for application to the optical modulator 41 is $f_m=Lf_{VCO}$. Further, the frequency of the input signal component $SC_R$ for application from the photodetector 42 to the phase comparator 51 is $Nf_a-nLf_{VCO}$, and the frequency of the signal for application from the multiplier 52 to the

TABLE 1

Concrete examples of numerical values in Embodiment 1

| No. | $Nf_a$ | N | $f_a$ | $f_{VCO}$ | K | L | M | $f_m$ | n | $Nf_a-nf_m$ |
|---|---|---|---|---|---|---|---|---|---|---|
| 1 | 160 Gbit/s | 8 | 20 GHz | 20 GHz | 2 | 3 | 1 | 30 GHz | 5 | 10 GHz |
| 2 | 160 Gbit/s | 4 | 40 GHz | 40 GHz | 4 | 3 | 1 | 30 GHz | 5 | 10 GHz |
| 3 | 320 Gbit/s | 8 | 40 GHz | 40 GHz | 4 | 3 | 2 | 30 GHz | 10 | 20 GHz |
| 4 | 160 GHz | 8 | 20 GHz | 20 GHz | 8 | 3 | 1 | 7.5 GHz | 21 | 2.5 GHz |
| 5 | 160 GHz | 4 | 40 GHz | 40 GHz | 16 | 3 | 1 | 7.5 GHz | 21 | 2.5 GHz |

Since $Nf_a-nf_m=(M/K)f_{VCO}<f_m$ holds true in any cases as shown above in Table 1, $(M/K)f_{VCO}$ will not coincide with a natural-number multiple of $f_m$ in the phase comparator 51. That is, this embodiment excludes the possibility that the phase comparison frequency $(M/K)f_{VCO}$ in the phase-locked loop becomes equal to the optical modulation frequency $f_m=(L/K)f_{VCO}$ containing no input signal component, or a natural-number multiple of the frequency $f_m$—this solves the problem of operation instability experienced in the prior art.

Incidentally, the multiplication numbers L and M of the multipliers 43 and 52 may take various values (natural numbers), depending on the degree of which of beat signals occurring in the optical modulator 41 is to be detected, or phase comparator 51 is $Mf_{VCO}$; the values of the integers L and M are chosen so that these two frequencies become equal to each other. No description will be repeated on the other parts and operations since they are similar to those in Embodiment 1.

In this embodiment, too, the local pulse stream $LP_L$ from the local pulse generating light source 22, which is output from the optical branching device 23, is in bit-phase synchronization with the input optical signal pulse stream $LP_R$. The repetition frequency $f_{VCO}$ of the local optical pulse stream $LP_L$ is J-multiplied by the optical multiplier 24 to provide the local clock $CK_L$ of a frequency $Jf_{VCO}$. Hence, the afore-mentioned parameters can be set so that the frequency $Mf_{VCO}$ of the one input signal to the phase comparator 51 does not become an integral multiple of the modulation frequency $f_m = Lf_{VCO}$. The optical multiplier 24 in this embodiment constitutes ratio setting means for setting the frequency of the local feedback signal $FB_L$ to an integral (2 or larger) multiple of the local clock $CK_L$.

Figure 5A:
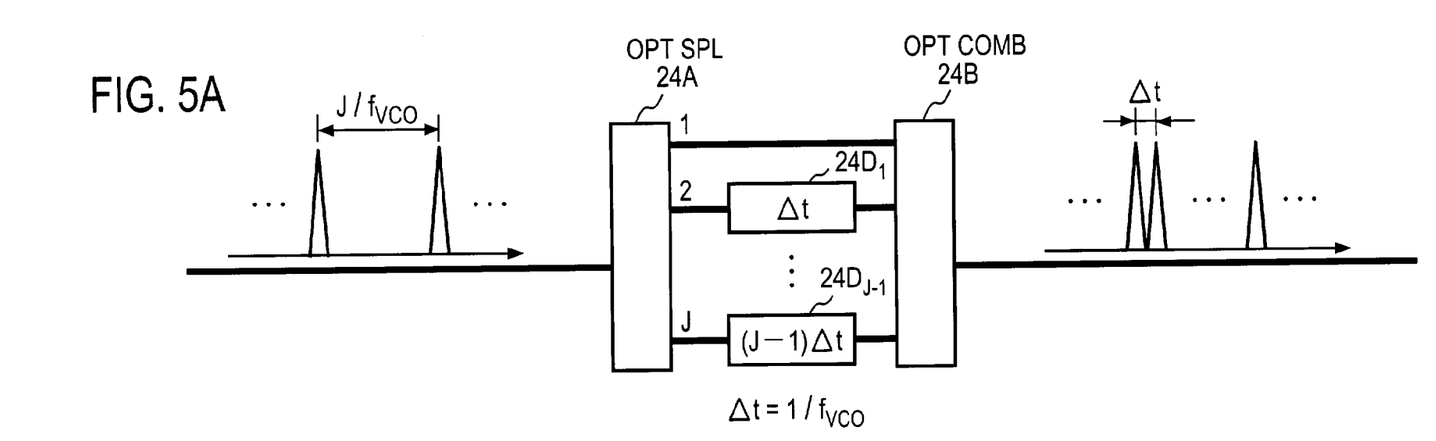
FIG. 5A is a block diagram depicting an example of an optical multiplier 24 in FIG. 4.

FIG. 5A illustrates in block form an example of the optical multiplier 24. In the illustrated example the optical multiplier 24 has a construction in which J output ports of a one-input-J-output optical splitter 24A and J input ports of a J-input-one-output optical combiner 24B are interconnected via delay elements $24D_1$, $24D_2$, ..., $24D_{j-1}$ of delay amounts $(n-1)\Delta t$, where $n = 1, 2, \ldots, J$ (the first ports being directly interconnected with no delay element interposed therebetween). By setting the delay amounts of the delay elements to values that satisfy $\Delta t = 1/f_{VCO}$, the local optical pulse stream $LP_L$ of the repetition period $J/f_{VCO}$ can be converted to the local clock stream $CK_L$ of a repetition period $\Delta t = 1/f_{VCO}$. The optical splitter 24A and the optical combiner 24B can each be formed by a multi-mode interference coupler such as a fusion-elongated optical fiber coupler or planar lightwave device.

Figure 5B:
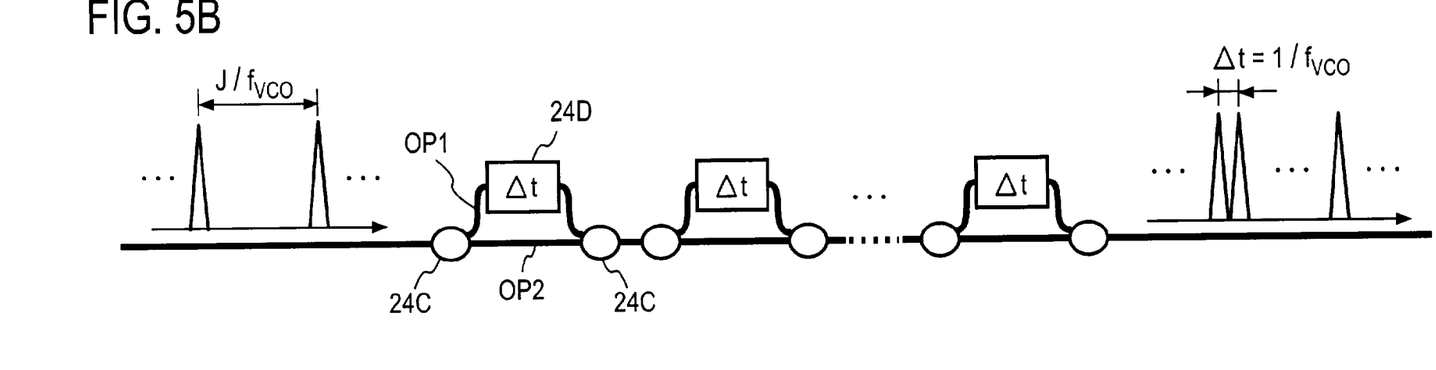
FIG. 5B is a block diagram depicting another example of the optical multiplier 24.

FIG. 4B illustrates another example of the optical multiplier 24. The illustrated example is a cascade connection of J–1 asymmetrical Mach-Zehnder interferometers each formed by two 1×2-couplers 24C interconnected with two optical paths OP1 and OP2 formed therebetween and a delay element 24D of the delay $\Delta t = 1/f_{VCO}$ inserted in the one optical path OP1 in series relation thereto.

In Table 2 there are shown examples of numerical values in the second embodiment.

correspond to systems of the same frequency design. That is, according to this embodiment, it is possible to suppress an increase in the oscillation frequency $f_{VCO}$ of the voltage-controlled oscillator 21 which is caused by an increase in the repetition frequency $Nf_a$ of the input optical signal pulse and in the repetition frequency $f_a$ of its low-degree group signal. This means that this embodiment is capable of suppressing an increase in the oscillation frequency of the local pulse generating light source 22, too. The speedup of the local pulse generating light source 22 increases the workload of a high-frequency circuit for driving it, and further, the attainment of the required optical SN ratio calls for larger mean optical power—this increases the workload on the light source itself and an optical amplifier (the light source is usually formed by a combination of a laser light emitting element and an optical fiber amplifier). Accordingly, the suppression of the oscillation frequency of the light source 22 improves the operation stability of the entire system and reduces its cost.

Embodiment 3

Figure 6:
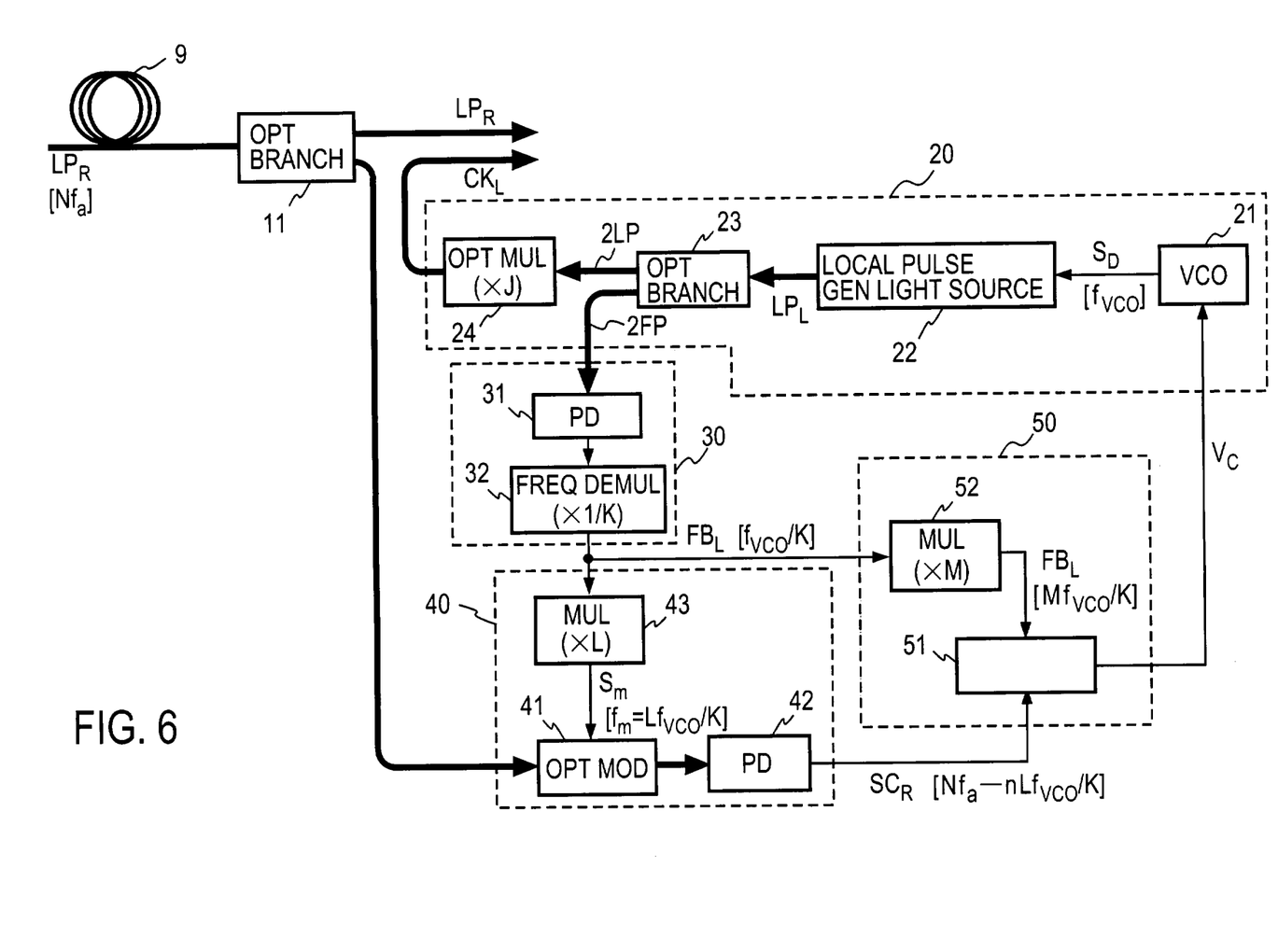
FIG. 6 is a block diagram illustrating a third embodiment of the ultrahigh-speed clock extraction circuit according to the present invention.

FIG. 6 illustrates in block form a third embodiment of the ultrahigh-speed clock extraction circuit according to the present invention, which is a another modified form of the first embodiment. As is the case with the second embodiment of FIG. 4, this embodiment uses the optical multiplier 24 added to the output path 2LP of the optical branching device 23 in the first embodiment of FIG. 3. The operation

TABLE 2

Concrete examples of numerical values in Embodiment 2

| No. | $Nf_a$ | N | $f_a$ | $f_{VCO}$ | J | L | M | $f_m$ | N | $Nf_a - nf_m$ |
|-----|--------|---|-------|-----------|---|---|---|-------|---|---------------|
| 1 | 160 Gbit/s | 8 | 20 GHz | 10 GHz | 2 | 3 | 1 | 30 GHz | 5 | 10 GHz |
| 2 | 160 Gbit/s | 4 | 40 GHz | 10 GHz | 4 | 3 | 1 | 30 GHz | 5 | 10 GHz |
| 3 | 320 Gbit/s | 8 | 40 GHz | 10 GHz | 4 | 3 | 2 | 30 GHz | 10 | 20 GHz |

In the above, multipliers of a multiplication number 1 can be omitted. Since the multiplication number M in both rows Nos. 1 and 2 in Table 2 is 1, the multiplier 52 concerned can be omitted.

As described above, this embodiment also precludes the possibility that the phase comparison frequency ($Mf_{VCO}$) in the phase-locked loop becomes equal to the optical modulation frequency ($f_m = Lf_{VCO}$) or a natural-number integral of the frequency $f_m$.

Further, the example of numerical values given in Columns Nos. 1 to 3 in Table 1 and in Nos. 1 to 3 in Table 2 of this embodiment is the same as described above with reference to the first and second embodiments. The optical multiplier 24 and the frequency demultiplier 32 constitute ratio setting means for setting the frequency of the local feedback signal $FB_L$ to an integral (2 or larger) fraction of the frequency of the local clock $CK_L$.

Parameters L, K and M are selected to satisfy the frequency relationships $Nf_a - (nL/K)f_{VCO} = (M/K)f_{VCO}$ in the phase comparator 51. Table 3 shows examples of concrete numerical values in his embodiment.

TABLE 3

Concrete numerical values in Embodiment 3

| No. | $Nf_f$ | N | $f_a$ | $f_{VCO}$ | J | K | L | M | $f_m$ | n | $Nf_a - nf_m$ |
|-----|--------|---|-------|-----------|---|---|---|---|-------|---|---------------|
| 1 | 160 Gbit/s | 4 | 40 GHz | 20 GHz | 2 | 2 | 3 | 1 | 30 GHz | 5 | 10 GHz |
| 2 | 320 Gbit/s | 8 | 40 GHz | 20 GHz | 2 | 2 | 3 | 2 | 30 GHz | 10 | 20 GHz |
| 3 | 160 Gbit/s | 4 | 40 GHz | 20 GHz | 2 | 8 | 3 | 1 | 7.5 GHz | 21 | 2.5 GHz |
| 4 | 320 Gbit/s | 8 | 40 GHz | 20 GHz | 2 | 8 | 3 | 2 | 7.5 GHz | 42 | 5 GHz |

The numerical values given in the rows Nos. 2 and 3 in Tables 1 and 2 and numerical values in the rows Nos. 1 and 2 in Table 3 correspond to systems of the same frequency design.

This embodiment differs from the first and second embodiments in that 20 GHz can be selected as the frequency $f_{VCO}$ of the voltage-controlled oscillator 21 in the case of generating the 20 GHz local clock stream $CK_L$.

This is related to the characteristic of the light source 22. For example, when a mode-locked semiconductor laser is used as the light source 22, since the repetition frequency and the resonator length are in inverse proportion to each other, a decrease in the repetition frequency causes an increase in the resonator length, making the fabrication of the laser more difficult. Usually, a 10 GHz repetition frequency allows more ease in the fabrication of mode-locked semiconductor laser than a 20 GHz repetition frequency. In the case of using the numerical values given in columns No. 2 in Tables a and 2 and in the row No. 1 in Table 3, that is, in the case of generating a 40 GHz clock $CK_L$ for the input optical signal, the configuration using the 20 GHz light source becomes possible for the first time with this embodiment.

As described previously with respect to the second embodiment, the speedup of the light source 22 usually increases the workload for the other parts, but in some cases a low-speed operation is not optimum from the viewpoint of its fabrication as described above. This embodiment is intended to solve such a problem and is advantageous in that the combined use of the electrical frequency demultiplier 32 and the optical multiplier 24 enables implementation of more flexible phase-locked loop circuitry, providing increased operation stability and permitting cost reduction.

Embodiment 4

Figure 7:
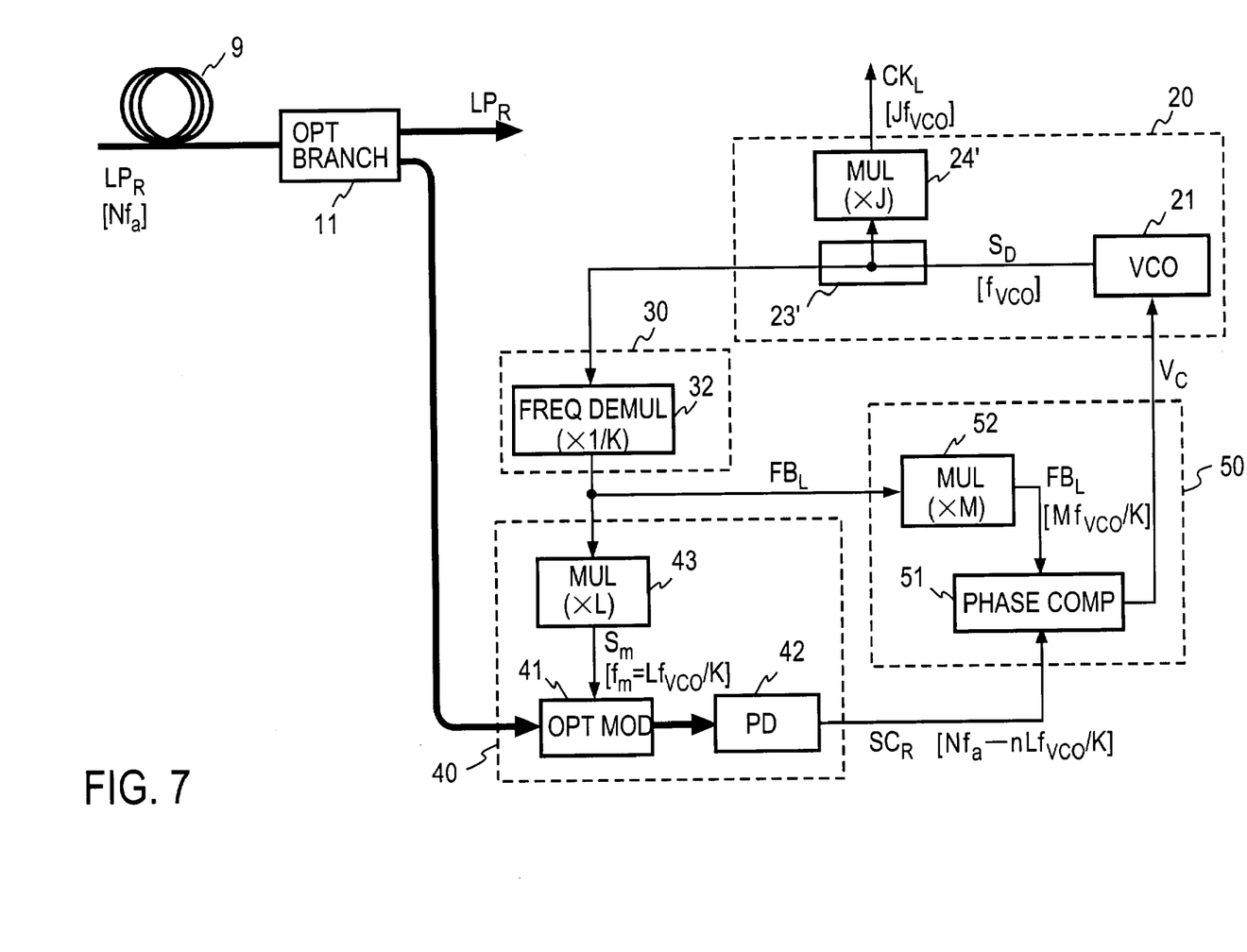
FIG. 7 is a block diagram illustrating a fourth embodiment of the ultrahigh-speed clock extraction circuit according to the present invention.

FIG. 7 illustrates in block form a fourth embodiment of the ultrahigh-speed clock extraction circuit according to the present invention. Unlike the first to third embodiments this embodiment outputs an electrical locally generated clock $CK_L$ synchronized with the input optical signal pulse stream $LP_R$ instead of outputting the optical clock. More specifically, the light source 22 and the photodetector 31 in the third embodiment of FIG. 6 are removed, and the optical branching device 23 and the optical multiplier 24 are replaced with an electrical branching device 23' and an electrical multiplier 24'. The output from the voltage-controlled oscillator 21 is branched by the branching device 23' to the multiplier 24' and the frequency demultiplier 32.

The other arrangements and operations are similar to those of the FIG. 6 embodiment. That is, the output signal of the frequency $f_{VCO}$ from the voltage-controlled oscillator 21 is J-multiplied by the multiplier 24', and the phase-locked loop is configured so that the electrical local clock $CK_L$ fed from the multiplier 24' coincides with the phase of the input optical signal pulse stream $LP_R$. In the phase comparator 51, $Nf_a-(nL/K)f_{VCO}=(M/K)f_{VCO}$ is satisfied.

The multiplier 24' corresponds to the optical multiplier 24 in the second embodiment, by which an increase in the frequency in the phase-locked loop can be suppressed. Further, the combined use of the frequency demultiplier 32 and the multiplier 24' corresponds to the combined use of the frequency demultiplier 32 and the optical multiplier 24 in the third embodiment. When the frequency demultiplication number K is 1, the frequency demultiplier 32 can be omitted. The multiplier 24' and the frequency demultiplier 32 constitute ratio setting means for setting the frequency of the local feedback signal $FB_L$ to an integral (2 or larger) fraction of the frequency of the local output clock $CK_L$.

Table 4 shows examples of concrete numerical values of the parameters in the fourth embodiment.

TABLE 4

Examples of concrete numerical values in Embodiment 4

| No. | $Nf_a$ | N | $f_a$ | $f_{VCO}$ | J | K | L | M | $f_m$ | n | $Nf_a-nf_m$ |
|---|---|---|---|---|---|---|---|---|---|---|---|
| 1 | 160 Gbit/s | 8 | 20 GHz | 10 GHz | 2 | 1 | 3 | 1 | 30 GHz | 5 | 10 GHz |
| 2 | 160 Gbit/s | 4 | 40 GHz | 20 GHz | 2 | 2 | 3 | 1 | 30 GHz | 5 | 10 GHz |
| 3 | 320 Gbit/s | 8 | 40 GHz | 20 GHz | 2 | 2 | 3 | 2 | 30 GHz | 10 | 20 GHz |
| 4 | 160 Gbit/s | 8 | 20 GHz | 10 GHz | 2 | 4 | 3 | 1 | 7.5 GHz | 21 | 2.5 GHz |
| 5 | 160 Gbit/s | 4 | 40 GHz | 20 GHz | 2 | 8 | 3 | 1 | 7.5 GHz | 21 | 2.5 GHz |
| 6 | 320 Gbit/s | 8 | 40 GHz | 20 GHz | 2 | 8 | 3 | 2 | 7.5 GHz | 42 | 5 GHz |

The output local electrical clock C in this embodiment is phase-synchronized with the input optical signal pulse stream A; therefore, by using this clock as a drive signal for the electroabsoprtion optical modulator that is, for example, an electrical-control-type optical gate, it can be operated as an optical time-division demultiplexer for the input optical signal.

Embodiment 5

Figure 8:
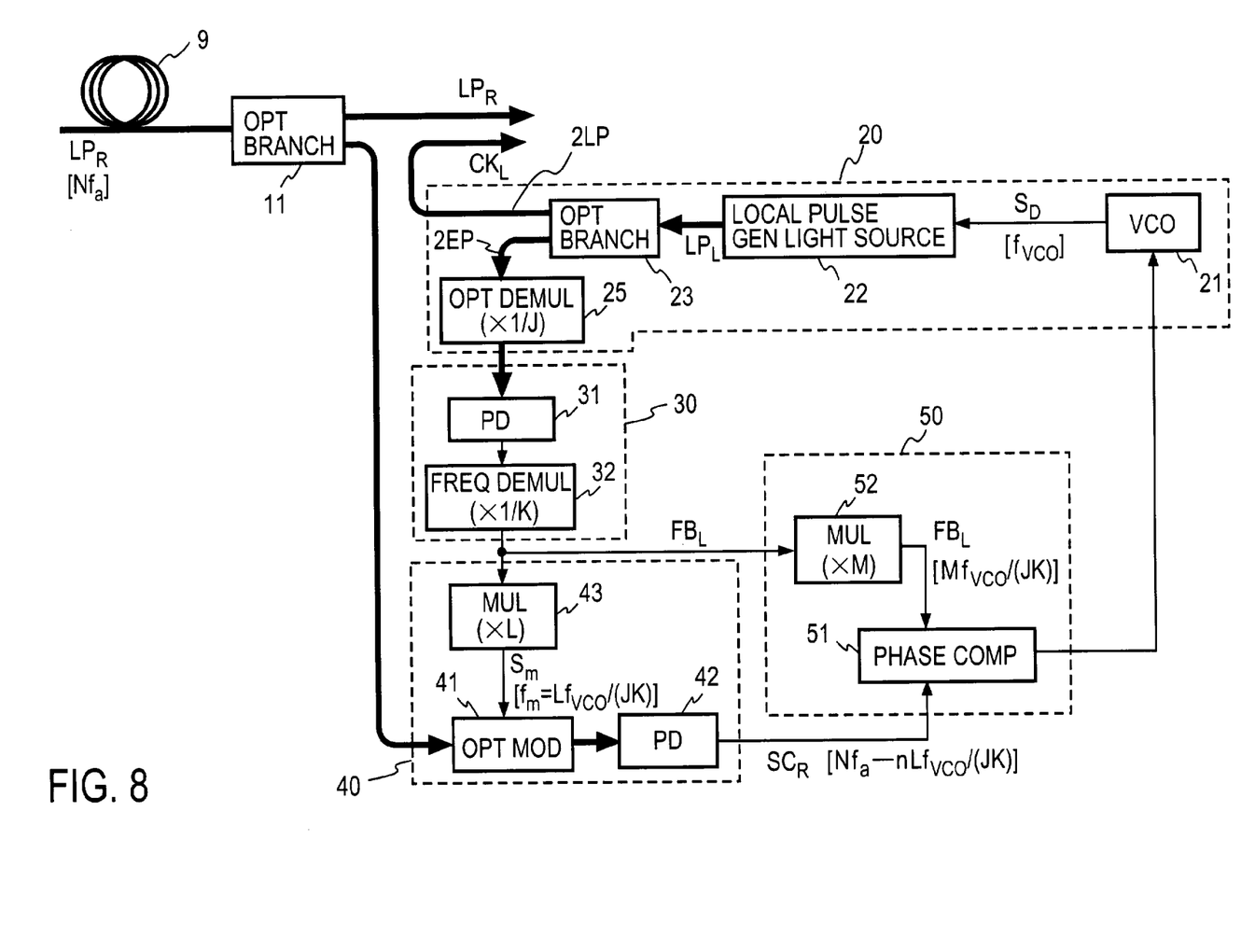
FIG. 8 is a block diagram illustrating a fifth embodiment of the ultrahigh-speed clock extraction circuit according to the present invention.

FIG. 8 illustrates in block form a fifth embodiment of the ultrahigh-speed clock extraction circuit, which is a modification of the third embodiment shown in FIG. 6. In this embodiment, the optical multiplier 24 inserted in the output path 2LP in the third embodiment is replaced with an optical demultiplier 25 inserted in the feedback path 2FP, by which the local feedback clock $CK_L$ of the frequency $f_{VCO}$ is frequency divided down to 1/J and the output of which is applied to the photodetector 31. The optical demultiplier 25 and the frequency demultiplier 32 constitute ratio setting means for setting the frequency of the locally generated feedback signal $FB_L$ to an integral (2 or larger) fraction of the frequency of the locally generated output clock $CK_L$. As is the case with the third embodiment, this embodiment provides greater flexibility in the design of the phase-locked loop, providing increased operation stability and permitting cost reduction. Table 5 shows concrete examples of numerical values in this embodiment.

TABLE 5

Concrete example of numerical values in Embodiment 5

| No. | $Nf_f$ | N | $f_a$ | $f_{VCO}$ | J | K | L | M | $f_m$ | n | $Nf_a - nf_m$ |
|---|---|---|---|---|---|---|---|---|---|---|---|
| 1 | 160 Gbit/s | 4 | 40 GHz | 40 GHz | 2 | 2 | 3 | 1 | 30 GHz | 5 | 10 GHz |
| 2 | 320 Gbit/s | 8 | 40 GHz | 40 GHz | 2 | 2 | 3 | 2 | 30 GHz | 10 | 20 GHz |
| 3 | 160 Gbit/s | 4 | 40 GHz | 40 GHz | 4 | 1 | 3 | 1 | 30 GHz | 5 | 10 GHz |
| 4 | 320 Gbit/s | 8 | 40 GHz | 40 GHz | 4 | 1 | 3 | 2 | 30 GHz | 10 | 20 GHz |
| 5 | 160 Gbit/s | 4 | 40 GHz | 40 GHz | 4 | 4 | 3 | 1 | 7.5 GHz | 21 | 2.5 GHz |
| 6 | 160 Gbit/s | 4 | 40 GHz | 40 GHz | 2 | 8 | 3 | 1 | 7.5 GHz | 21 | 2.5 GHz |
| 7 | 320 Gbit/s | 8 | 40 GHz | 40 GHz | 4 | 4 | 3 | 2 | 7.5 GHz | 42 | 5 GHz |
| 8 | 320 Gbit/s | 8 | 40 GHz | 40 GHz | 2 | 8 | 3 | 2 | 7.5 GHz | 42 | 5 GHz |

Figure 9:
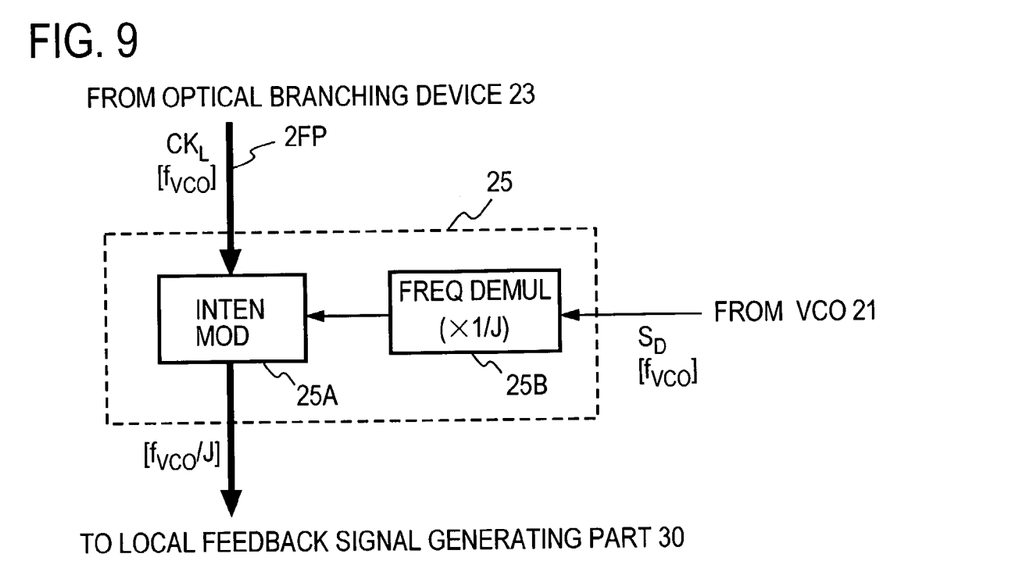
FIG. 9 is a block diagram showing an example of an optical frequency demultiplier 25.

FIG. 9 depicts in block form a concrete example of the optical demultiplier 25. The optical demultiplier 25 possesses the function of frequency-dividing down to 1/J the repetition of the local optical pulse stream of the repetition frequency $f_{VCO}$ input thereto via the feedback path 2FP from the optical branching device 23 and applying the frequency-divided output to the feedback local signal generating part 30. In FIG. 9 the optical demultiplier 25 comprises an intensity modulator 25A and a frequency demultiplier 25B, and frequency-divides the drive signal of the frequency $f_{VCO}$ from the voltage-controlled oscillator 21 down to 1/J to generate an electrical signal of a frequency $(1/J)f_{VCO}$, which is applied to the intensity modulator 25A to gate the local feedback clock $CK_L$ with a period $J/f_{VCO}$, thereby extracting optical pulses. By this, the repetition frequency the local feedback clock $CK_L$ can be demultiplied down to $f_{VCO}/J$.

Alternatively, since the voltage-controlled oscillator 21 can be implemented by a combination of a voltage-controlled oscillator of a frequency lower than $f_{VCO}$ and a multiplier as described previously with reference to the first embodiment, the use of an appropriate multiplier will permit generation of an electrical signal of the frequency $(1/J)f_{VCO}$. In such an instance, the frequency demultiplier 25B is unnecessary since the output of the frequency $f_{VCO}/J$ from the voltage-controlled oscillator needs only to be applied directly to the intensity modulator 25.

The intensity modulator can be formed using, for example, an LiNbO$_3$ Mach-Zehnder optical modulator or electroabsorption optical modulator. The gate width of such an intensity modulator is as large as several tens of picosecond; for example, when it is driven by a 10 GHz sine wave, the intensity modulator accommodates a phase shift between the drive electrical signal and the local optical pulse stream which is caused by a fluctuation delay occurring in the local optical pulse stream generating part. Hence, the frequency demultiplying operation does not become unstable.

Figure 10:
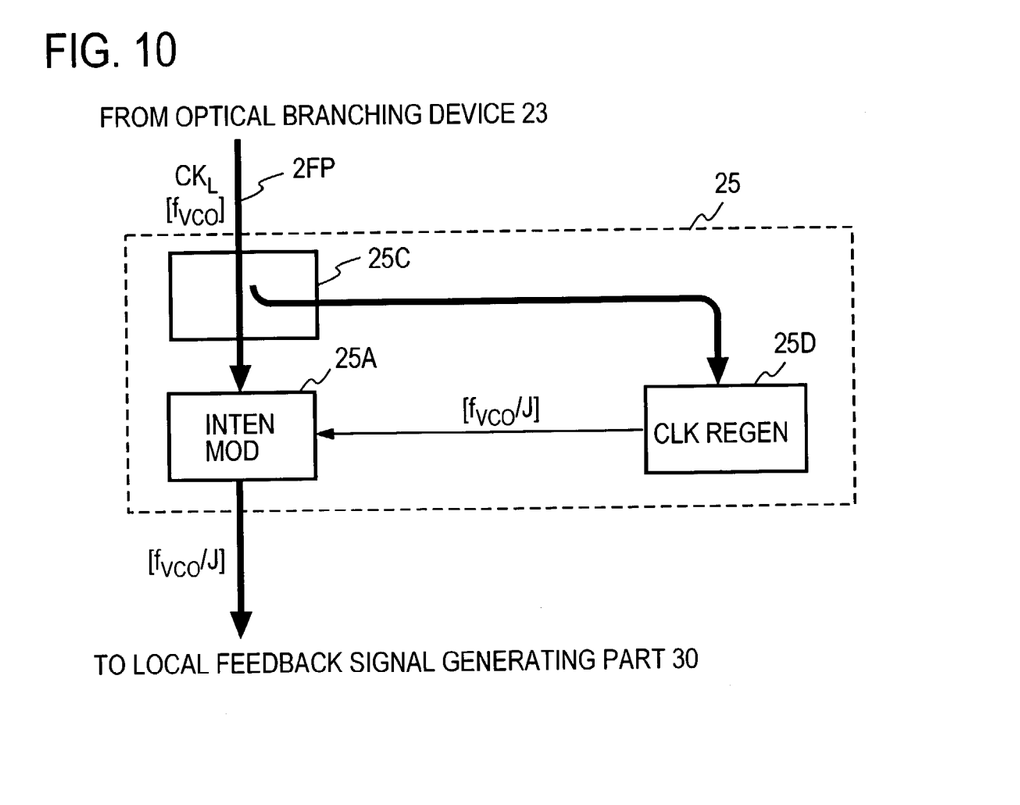
FIG. 10 is a block diagram showing another example of the optical frequency demultiplier 25.

FIG. 10 depicts another concrete example of the optical demultiplier 25. This example is common to the FIG. 9 example in the implementation of optical demultiplication by thinning out local optical pulse stream through use of the intensity modulator 25A, but differs from the latter in the way of generating an electrical signal for driving the intensity modulator 25A. In this example, the local feedback clock $CK_L$ is branched by an optical coupler 25C from the feedback path 2FP and the branched output is fed to a clock regenerator 25D, which extracts an electrical clock of the frequency $f_{VCO}/J$ which is a J-demultiplied version of the local feedback clock $CK_L$ of the frequency $f_{VCO}$ and from which the extracted electrical clock is provided to the intensity modulator 25A.

EFFECT OF THE INVENTION

As described above, the ultrahigh-speed clock extraction circuit according to the present invention precludes the possibility that in the case of a particular combination of the repetition frequency of the input optical signal pulse stream and the repetition frequency of a local optical pulse stream or the frequency of a local electrical clock, the frequency of a modulation signal of the optical modulator and a frequency of its natural-number multiple become equal to a frequency down-converted from the input optical signal pulse stream, thereby solving the problem of unstable operation of the clock extraction circuit. The particular combination of frequencies refers to the case where the repetition frequencies of, for example, the input optical signal pulse stream and the local optical pulse stream are 160 Gbit/s and 20 GHz, respectively. This is a combination of an optical signal and an optical control signal which is often used when an 8-channel frequency 20 Gbit/s is subjected to optical time-division-multiplexing to form a 10 Gbit/s optical signal. The 160 Gbit/s frequency will be very likely used as a standard repetition frequency of the optical time-division-multiplexed signal, and hence it is very important.

What is claimed is:

1. An ultrahigh-speed clock extraction circuit for obtaining a local clock synchronized in bit phase with an input optical signal pulse stream, said extraction circuit comprising:

a local clock generating part which generates a local clock of a frequency controlled by a voltage control signal and branches the local clock into a local output clock and a local feedback clock;

a local feedback signal generating part which generates a local feedback signal from said local feedback clock;

an input signal component generating part made up of a modulation signal generating part for generating a modulation signal containing phase information of said local feedback signal, an optical modulator for modulating an input optical signal pulse stream by said modulation signal to generate a modulated input optical signal stream, and a photodetector supplied with said modulated input optical signal pulse stream, for outputting an input signal component electrical signal having a down-converted frequency of said modulated input optical signal pulse stream and having bit-phase information thereof;

a phase comparison part which compares the phases of said local feedback signal and said input signal component electrical signal and outputs, as said voltage control signal, the voltage corresponding to their phase difference; and ratio setting means which sets the frequency of said local feedback signal to an integral fraction of the frequency of said output local clock so that said down-converted frequency of said input signal component electrical signal differs from a natural-number multiple of the frequency of said modulation signal;

wherein a path containing said phase comparison part, said local clock generating part and said local feedback signal generating part constitutes a phase-locked loop for said input signal component electrical signal.

2. The circuit of claim 1, wherein said local clock generating part comprises a voltage-controlled oscillator for generating a drive signal of a frequency controlled by said voltage control signal, a local pulse generating light source driven by said drive signal to generate a local optical pulse stream, and an optical branching device for branching said local optical pulse stream into said output local clock and said local feedback clock; and wherein said local feedback signal generating part comprises a photodetector for converting said local feedback clock to a local electrical signal, and a frequency demultiplier for frequency-demultiplying said local electrical signal down to 1/K to generate said local feedback signal, said K being an integer equal to or greater than 1 and said frequency demultiplier forming said ratio setting means.

3. The circuit of claim 1, wherein said local clock generating part comprises a voltage-controlled oscillator for generating a local clock of a frequency controlled by said voltage control signal, and a J multiplier for J-multiplying one of two branched versions of said local clock from said voltage-controlled oscillator to provide an output local clock, said J being an integer equal to or greater than 2;

wherein said local feedback signal generating part includes a 1/K frequency demuliplier for frequency-demultiplying the other branched version of said local clock down to 1/K to provide said local feedback signal, said K being an integer equal to or greater than 1; and wherein said J multiplier and said 1/K frequency demultiplier constitute said ratio setting means.

4. The circuit of claim 1, wherein said local clock generating part comprises a voltage-controlled oscillator for generating a drive signal of a frequency controlled by said voltage control signal, a local pulse generating light source driven by said drive signal to generate local optical pulse stream, an optical branching device for branching said local optical pulse stream into two outputs, one of said two branched outputs being provided as said output local clock, and an optical frequency demultiplier for frequency demultiplying the other of said two branched outputs down to 1/J to generate said local feedback clock, said J being an integer equal to or greater than 2;

wherein said local feedback signal generating part comprises a photodetector for converting said local feedback clock to a local electrical signal, and a frequency demultiplier for frequency demultiplying said local electrical signal down to 1/K to generate said local feedback signal, said K being an integer equal to or greater than 1; and wherein said optical frequency demultiplier and said frequency demultiplier constitute said ratio setting means.

5. The circuit of claim 1, wherein said local clock generating part comprises a voltage-controlled oscillator for generating a drive signal of a frequency controlled by said voltage control signal, a local pulse generating light source driven by said drive signal to generate a local optical pulse stream, an optical branching device for branching said local optical pulse stream into two outputs, one of said two branched output being provided as said local feedback clock, and an optical multiplier for J-multiplying the other of said two branched output to generate said output local clock, said J being an integer equal to or greater than 2 and said optical multiplier forming said ratio setting means; and wherein said local feedback signal generating part includes a photodetector for converting said local feedback optical pulse stream to a local feedback signal.

6. The circuit of claim 1, wherein said local clock generating part comprises a voltage-controlled oscillator for generating a drive signal of a frequency controlled by said voltage control signal, a local pulse generating light source driven by said drive signal to generate a local optical pulse stream, an optical branching device for branching said local optical pulse stream into two outputs, one of said two branched output being provided as said local feedback clock, and an optical multiplier for J-multiplying the other of said two branched output to generate said output local clock, said J being an integer equal to or greater than 2 and said optical multiplier forming said ratio setting means; and wherein said local feedback signal generating part comprises photodetector for converting said local feedback clock into a local electrical signal, and a 1/K frequency demultiplier for frequency demultiplying said local electrical signal down to 1/K to generate said local feedback signal, said K being an integer equal to or greater than 2 and said optical multiplier and said 1/K frequency demultiplier constituting said ratio setting means.

7. The circuit of any one of claims 1 to 6, wherein said optical modulator is an intensity modulator.

8. The circuit of any one of claims 1 to 6, wherein said optical modulator is an electroabsorption optical modulator.

9. The circuit of any one of claims 1 to 6, wherein said optical modulator is an optical comb generator.

10. The circuit of any one of claims 1 to 6, wherein said optical modulator is an optical phase modulator.

11. The circuit of any one of claims 1 to 6, wherein said optical modulator is a semiconductor optical amplifier.

12. The circuit of any one of claims 1 to 6, wherein said phase comparison part comprises a multiplier for M-multiplying said local feedback signal from said local feedback signal generating part, said M being an integer equal to or greater than 1, and a phase comparator for detecting a phase difference between the output from said multiplier and said input signal component electrical signal from said input signal component generating part and for outputting said detected phase difference as said voltage control signal.

13. The circuit of any one of claims 1 to 6, wherein said modulation signal generating part is a multiplier for L-multiplying said local negative feedback signal to generate said modulation signal, said L being an integer equal to or greater than 1.

* * * * *